United States Patent [19]

Park

[11] Patent Number: 5,446,746
[45] Date of Patent: Aug. 29, 1995

[54] PATH MEMORY APPARATUS OF A VITERBI DECODER

[75] Inventor: Il-keun Park, Suwon, Rep. of Korea

[73] Assignee: Samsung Electronics Co., Ltd., Kyungki, Rep. of Korea

[21] Appl. No.: 112,282

[22] Filed: Aug. 27, 1993

[30] Foreign Application Priority Data

Aug. 31, 1992 [KR] Rep. of Korea ............... 92-15795

[51] Int. Cl.$^6$ .................................................. H03M 13/12
[52] U.S. Cl. ............................................................ 371/43
[58] Field of Search ............................................. 371/43

[56] References Cited

U.S. PATENT DOCUMENTS

| | | | |
|---|---|---|---|
| 3,789,360 | 1/1974 | Clark, Jr. et al. | 371/43 |
| 4,583,078 | 4/1986 | Shenoy et al. | 341/51 |
| 4,748,626 | 5/1988 | Wong | 371/30 |
| 4,777,636 | 10/1988 | Yamashita et al. | 371/43 |
| 4,905,317 | 2/1990 | Suzuki et al. | 341/51 |
| 5,220,570 | 6/1993 | Lou et al. | 371/43 |
| 5,257,263 | 10/1993 | Bazet et al. | 371/43 |

Primary Examiner—Stephen M. Baker
Attorney, Agent, or Firm—Lowe, Price, LeBlanc & Becker

[57] ABSTRACT

The path memory apparatus of a Viterbi decoder having an add-compare-select circuit for producing path select signals and a minimum state number every symbol period comprises a first selector for selecting between the path select signals and feedback signals in accordance with a start clock; a memory for receiving the output of a first selector and shifting the received output thereof in one direction in accordance with a system clock, and applying the output as the feedback signal; a second selector for selecting one among the outputs of the memory in accordance with a current state number; a third selector for selecting between the minimum state number and a next state number in accordance with the start clock, to produce the current state number; a trace-back calculator for receiving the current state number and the output of second selector and then producing the next state number; and a data convertor for performing an operating on the next state numbers, to produce a decoded information symbol per each symbol period.

7 Claims, 11 Drawing Sheets

PATH MEMORY APPARATUS OF A VITERBI DECODER

FIELD OF THE INVENTION

The present invention relates to a path memory apparatus of a Viterbi decoder, more particularly to a path memory apparatus performing a trace-back algorithm and included in the Viterbi decoder for receiving a code word which has been encoded based on a convolutional coding scheme and decoding the received code word with error corrections.

BACKGROUND OF THE INVENTION

A Viterbi decoder performs the Viterbi algorithm which is a "maximum likelihood" decoding algorithm, so as to decode the code symbol which has been encoded in accordance with a convolutional coding scheme. In the Viterbi algorithm, the received code sequence is compared with a plurality of path code sequences, and the path which has the shortest code distance is selected as the maximum likelihood path. The code sequence which corresponds to the maximum likelihood path is produced as a decoded code sequence. Here, the code sequence is constituted by a plurality of code symbols, and each path includes a plurality of branches having predetermined code symbols. The code distance refers to the difference between the received code sequence and the path code sequence.

As described above, Viterbi algorithms are widely used in the field of digital transmission systems such as satellite communication systems, earth network communication systems and mobile communication systems.

The general Viterbi decoder for performing the Viterbi algorithm operation comprises a branch metric, an add-compare-select circuit (hereinafter referred to as an "ACS circuit") and a path memory apparatus. The conventional path memory apparatus of a Viterbi decoder is implemented by comprising a plurality of select memory units arranged in a trellis structure corresponding the convolutional coding scheme, or by comprising a random access memory (RAM) and the peripheral circuits for the operation thereof.

In the former (utilizing the select memory units), however, as the number of code symbols in the code sequence increases, the number of select memory units increases by a geometric progression, resulting in a larger path memory apparatus. Meanwhile, the latter (utilizing the RAM) has an overly complex address generating circuitry, and thereby its realization is very difficult.

SUMMARY OF THE INVENTION

Accordingly, the object of the present invention is to provide the path memory apparatus of Viterbi decoder which has a simple structure resulting in a reduced size which can be implemented in a semiconductor integrated circuit.

To achieve the above object, the present invention provides a path memory apparatus of a Viterbi decoder having an add-compare-select circuit for producing path select signals and a minimum state number per each symbol period comprising:

first selecting Means for selecting between the path select signals and feedback signals in accordance with a start clock;

memory means for receiving the outputs of said first selecting means and shifting the received output in one direction in accordance with a system clock, and applying the outputs thereof to said first selecting means as feedback signals;

second selecting means for selecting one among the outputs of the memory means in accordance with a current state number;

third selecting means for selecting between the minimum state number and a next state number in accordance with the start clock to produce the current state number;

trace-back calculating means for receiving the current state number and the output of said second selecting means and then producing the next state number; and data converting means for performing an operation on the next state number to produce a decoded information symbol per each symbol period.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Figure 1:
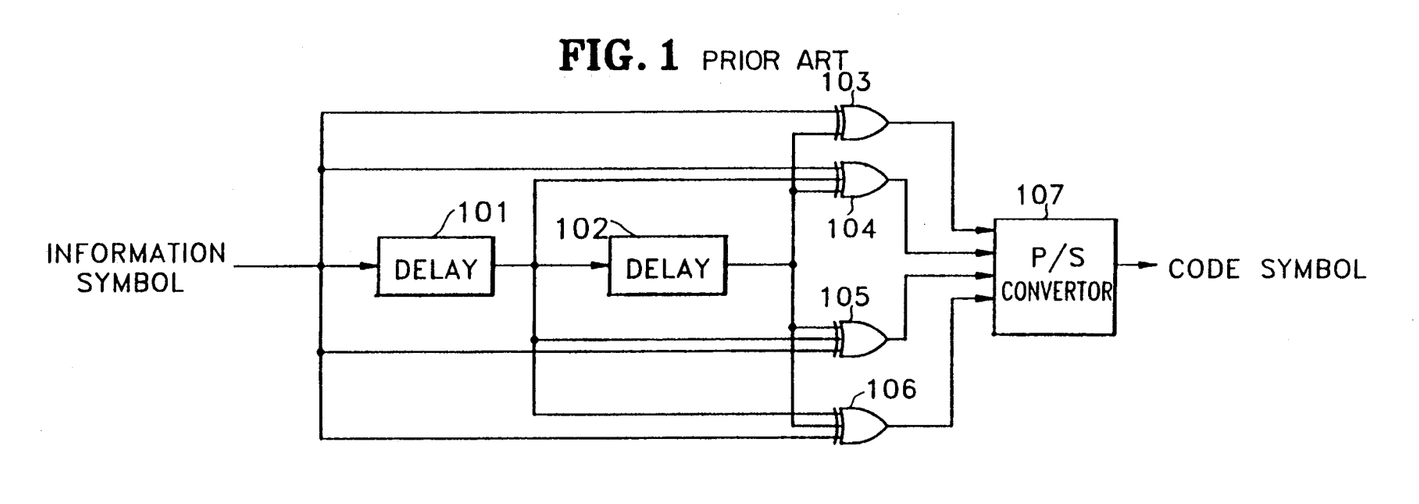
FIG. 1 is a block diagram of a convolutional encoder.

FIG. 1 is a block diagram of a convolutional encoder, which includes two delay elements 101 and 102, four XOR gates 103–106 and a parallel-to-series (P/S) converter 107. This encoder is called a (4,1) convolutional encoder, where four is the number of bits included in one code symbol and one is the number of bits included in one information symbol. In other words, an (n,k) convolutional encoder operates on k bits of an information symbol to produce n bits of a code symbol.

Referring to FIG. 1, the information sequence which is constituted by a plurality of information symbols is sequentially applied to the convolutional encoder by one bit every symbol period. Delay elements 101 and 102 delay their inputs by one symbol period and then to produce delayed outputs thereof. Delay elements 101 and 1.02 may be implemented by D flip-flops. Here, the input of the convolutional encoder and the outputs of delay elements 101 and 102 are selectively applied to XOR gates 103–106 based on the convolutional coding scheme. Each XOR gate 103–106 performs an exclusive-OR operation. Accordingly, the code symbol is influenced by the previous information symbols as well as the current information symbol. Here, we assume that the information sequence is {1, 0, 1, 1, 1, 0, 0, 1, 1 . . .} and the delay elements are initialized to zero.

Figure 2:
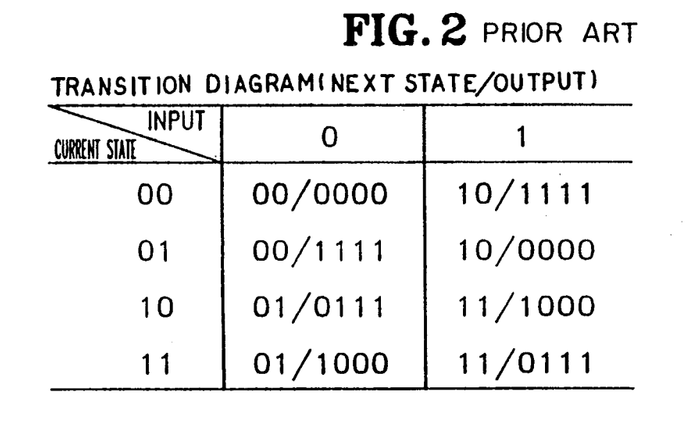
FIGS. 2, 3 and 4 show the scheme of the convolutional encoding which corresponds the convolutional encoder shown in FIG. 1.
Figure 3:
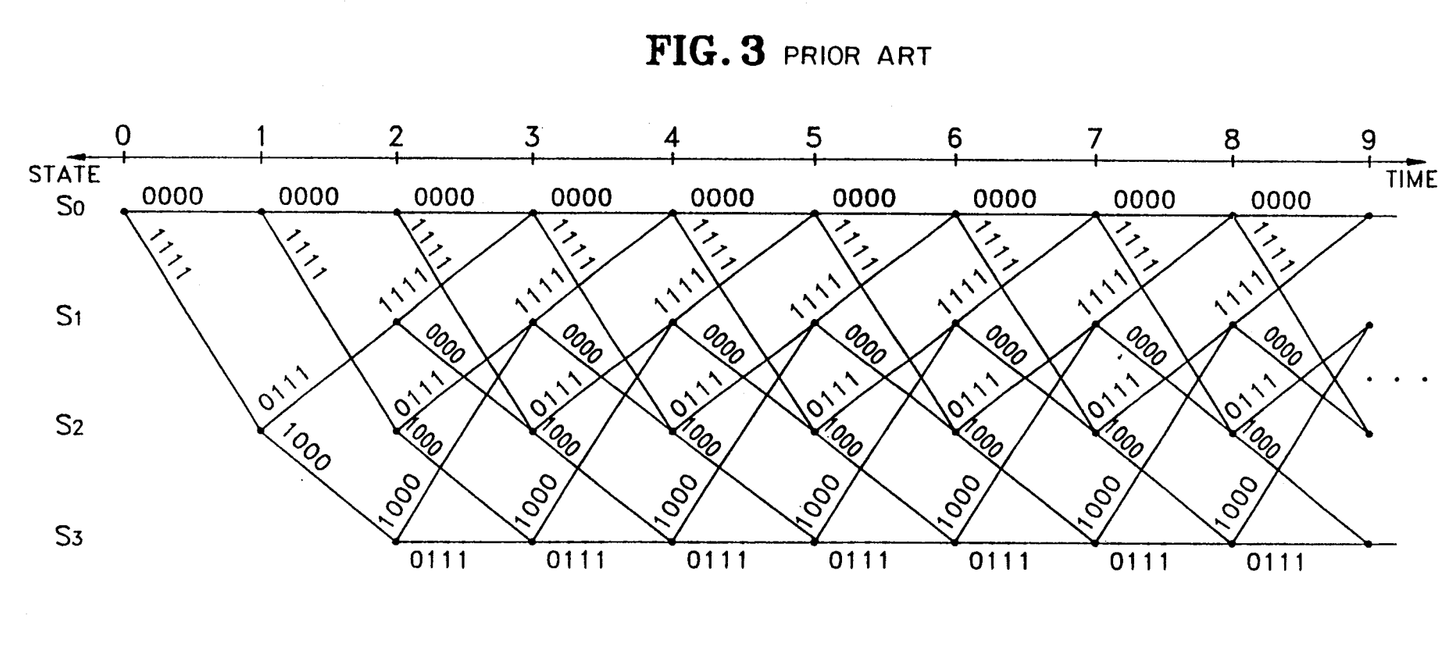
Figure 4:
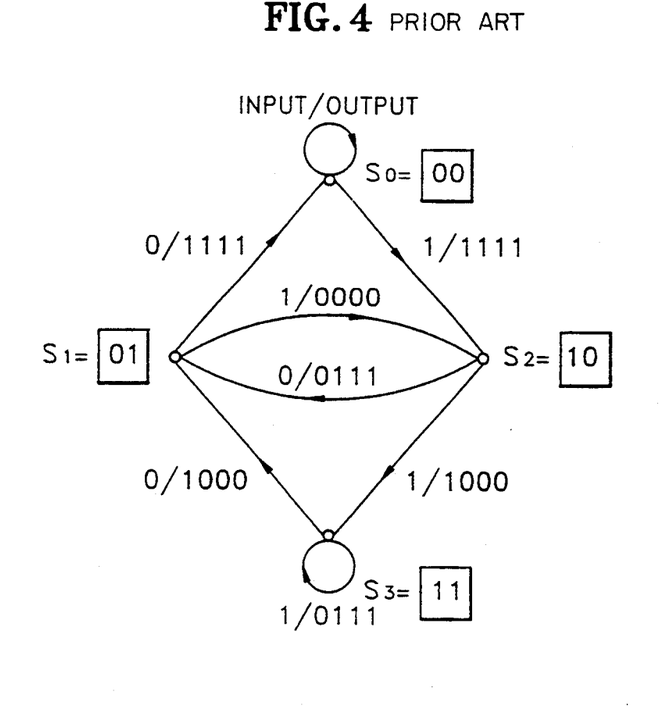

FIGS. 2, 3 and 4 show the scheme of the convolutional encoding which corresponds to the convolutional encoder of FIG. 1.

FIG. 2 is a truth table which shows the transition state/output in accordance with the input and current state. The "state" refers to the output of delay elements 101 and 102, which may be either "00," "01, "10" or "11." Here, the number of states is determined based on the number of delay elements included in the convolutional encoder. That is, the number of states is $2^m$, provided that the convolutional encoder has m delay elements. Each state has $2^k$ transitions, where k is the number of bits included in one information symbol. For example in this case k=1, if the input or the information symbol is a logic "1" and the current state is "10," the transition state will be "11" and the output or the code symbol will be "1000."

FIG. 3 is a trellis diagram for the convolutional coding which is performed by the convolutional encoder shown in FIG. 1. Referring to FIG. 3, each branch has a code symbol. Time point "0" has only one state which is denoted as "00" (or $S_0$) and time point "1" has two states which are denoted as "00" (or $S_0$) and "10 (or $S_2$). These results from the delay elements being initialized to zero.

FIG. 4 is a state diagram which relates to the convolutional coding scheme of FIG. 3. In FIG. 4, the arrows refer to the state transition, and the data appearing adjacent to the arrows refer to the inputs and outputs thereof. Here, the code sequence for the given information sequence {1, 0, 1, 1, 1, 0, 0, 1, 1 . . .} is produced as {1111, 0111, 0000, 1000, 0111, 1000, 1111, 1111, 1000 . . .}. The code sequence, which is constituted by a plurality of sequential code symbols, is transmitted from a transmitter to a receiver, or is recorded onto and then reproduced from a recording medium, which may result in error due to noise. The Viterbi decoder performs the decoding of the received code sequence, with error correction.

Figure 5:
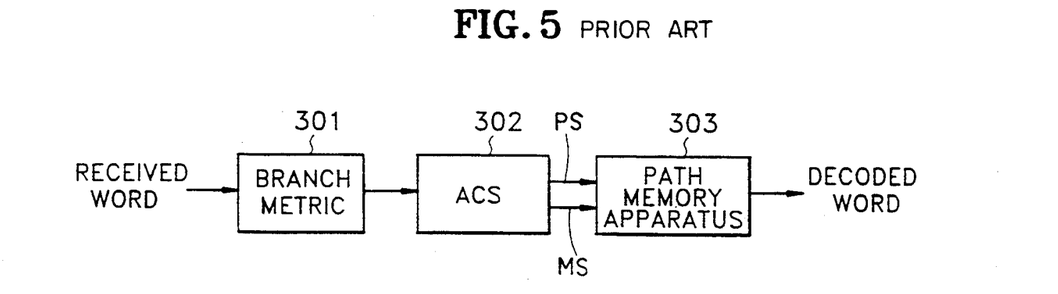
FIG. 5 is a block diagram of a Viterbi decoder.

FIG. 5 is a typical block diagram of a Viterbi decoder which comprises a branch metric circuit 301, an add-compare-select (ACS) circuit 302 and a path memory apparatus 303.

In FIG. 5, a branch metric circuit 301 receives sequentially the received code symbols included in the received code sequence, and produces branch metrics. The function of branch metric circuit 301 is explained with reference to FIG. 6. First, the code symbol "1011" is applied to branch metric circuit 301, wherein it is compared with a branch code symbol of each transition on the trellis diagram to produce a code distance such as Hamming distance of the branches as branch metric values. Here, the branch code symbol refers to the code symbol of each branch in the trellis diagram of encoder.

Figure 6:
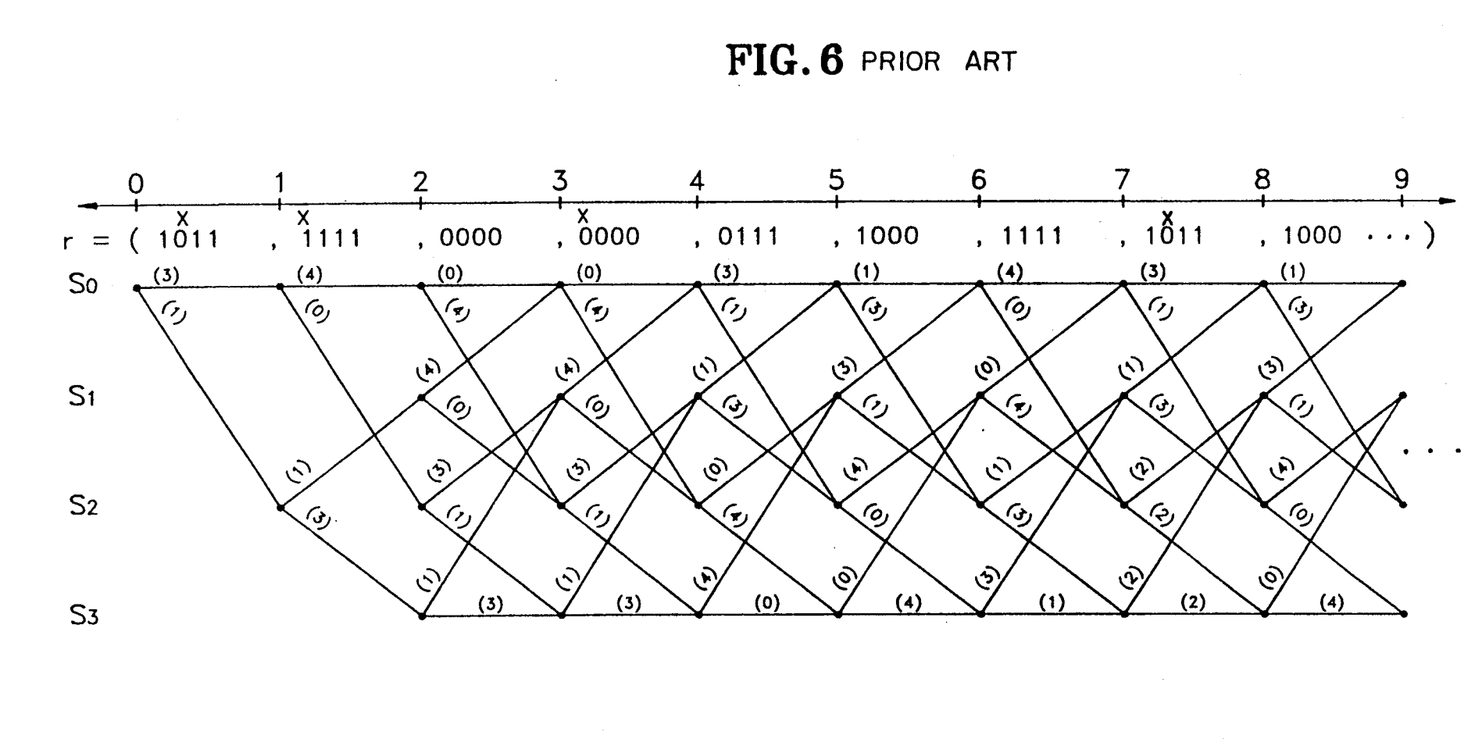
FIG. 6 is a trellis diagram for explaining the function of the branch metric shown in FIG. 5.

In FIG. 1, there are four states, and each state has two ($2^k$) branches. Therefore, eight (4×2) branches exist at any given time. Accordingly, branch metric circuit 301 produces eight branch metric values per each symbol period. Here, provided that the received code sequence is {1011, 1111, 0000, 0000, 0111, 1000, 1111, 1011, 1000. . .} as depicted in FIG. 6, the branch metric values produced by branch metric circuit 301 are represented as the following Table 1.

TABLE 1

| TIME POINTS → <br> BRANCH AND CODE SYMBOL ↓ | 0 | 1 | 2 | 3 | 4 | 5 | 6 | 7 | 8 | ... |
|---|---|---|---|---|---|---|---|---|---|---|
| B0($S_0$→$S_0$):0000 | 3 | 4 | 0 | 0 | 3 | 1 | 4 | 3 | 1 | ... |
| B1($S_0$→$S_2$):1111 | 1 | 0 | 4 | 4 | 1 | 3 | 0 | 1 | 3 | ... |
| B2($S_1$→$S_0$):1111 |   |   | 4 | 4 | 1 | 3 | 0 | 1 | 3 | ... |
| B3($S_1$→$S_2$):0111 |   |   | 0 | 0 | 3 | 1 | 4 | 3 | 1 | ... |
| B4($S_2$→$S_1$):0111 |   | 1 | 3 | 3 | 0 | 4 | 1 | 2 | 4 | ... |
| B5($S_2$→$S_3$):1000 |   | 3 | 1 | 1 | 4 | 0 | 3 | 2 | 0 | ... |
| B6($S_3$→$S_1$):1000 |   |   | 1 | 1 | 4 | 0 | 3 | 2 | 0 | ... |
| B7($S_3$→$S_3$):0111 |   |   | 3 | 3 | 0 | 4 | 1 | 2 | 4 | ... |

Returning to FIG. 5, ACS circuit 302 receives the branch metric values every symbol period, and performs operations thereon, to produce path select (PS) signals for each state and state number which has a minimum path metric at every time point or symbol period.

In more detail, ACS circuit 302 calculates the path metric values for the converged branches at each state, where the path metric refers to the sums of branch metric values included in tile path from the initial state of the initial time point to the state of the given time point. That is, at each state ACS circuit 302 adds the branch metric values to the path metric values of the previous time point based on tile convolutional coding scheme for producing a path metric values of that branch, and then selects the minimum path metric value (among the candidate path metric values related to the state) as the path metric value of the state among the states. The path having the minimum path metric value is also called the "survive" path, and each time point generally has one survive path. ACS produces the information of state number (or node number) which has minimum path metric at the time point as MS label. The path select signal PS refers to the selected branch among the branches related to the state to represent the survive branch. Thus, for example, an ACS circuit having four states produces four path select signals.

Figure 7:
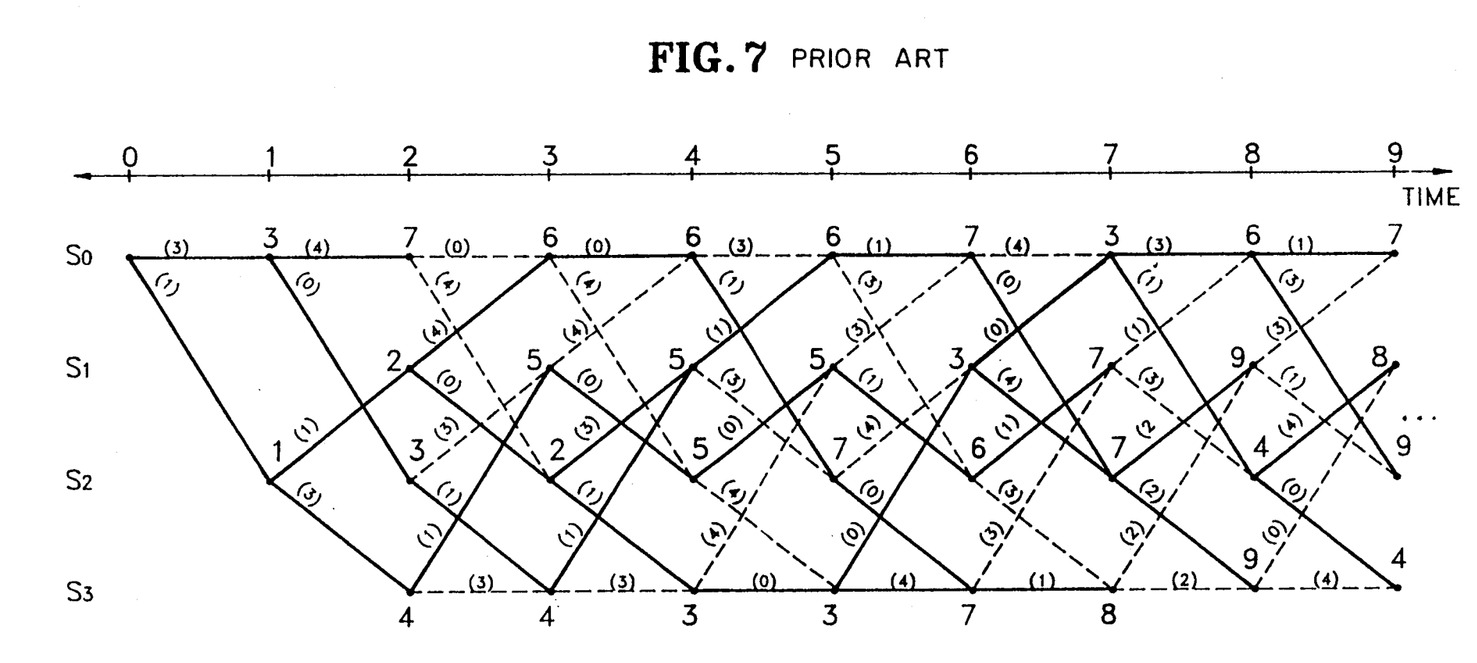
FIG. 7 is a trellis diagram for explaining the function of the ACS circuit shown in FIG. 5.

FIG. 7 shows the survive branch of each state. In FIG. 7, the dotted line branches are rejected and the solid line branches are selected to constitute the survive path. Here, the function for obtaining path metric values in ACS circuit 302 is represented thus:

$$PW_0(t) = MIN[PW_0(t-1)+B0(t), PW_1(t-1)+B2(t)] \quad (1\text{-}1)$$

$$PW_1(t) = MIN[PW_2(t-1)+B4(t), PW_3(t-1)+B6(t)] \quad (1\text{-}2)$$

$$PW_2(t) = MIN[PW_0(t-1)+B1(t), PW_1(t-1)+B3(t)] \quad (1\text{-}3)$$

$$PW_3(t) = MIN[PW_2(t-1)+B5(t), PW_3(t-1)+B7(t)] \quad (1\text{-}4)$$

where $PW_0(t)$-$PW_3(t)$ represent the path metric values at a given time [t] for each state, and $B0(t)$-$B7(t)$ represent the branch metric values at the given time [t].

Here, we suppose that the received code sequence is {1011,1111, 0000, 0000, 0111, 1000, 1111, 1011, 1000 . . .}. In this case, the path metric values at each state are as the following Table 2.

TABLE 2

| time points → | 1 | 2 | 3 | 4 | 5 | 6 | 7 | 8 | 9 | ... |
|---|---|---|---|---|---|---|---|---|---|---|
| $PW_0(t)$ | 3 | 7 | 6 | 6 | 6 | 7 | 3 | 6 | 7 | ... |
| $PW_1(t)$ | X | 2 | 5 | 5 | 5 | 3 | 7 | 9 | 8 | ... |
| $PW_2(t)$ | 1 | 3 | 2 | 5 | 7 | 6 | 7 | 4 | 9 | ... |
| $PW_3(t)$ | X | 4 | 4 | 3 | 3 | 7 | 8 | 9 | 4 | ... |

In Table 2, "x" signifies that there is no output or that it has a predetermined maximum value. Also, the path select signals which correspond to the survive path, are represented as the following Table 3 and the minimum state numbers are represented as the following Table 4.

TABLE 3

| time points → | 1 | 2 | 3 | 4 | 5 | 6 | 7 | 8 | 9 | ... |
|---|---|---|---|---|---|---|---|---|---|---|
| $PS_0(t)$ | 0 | 0 | 1 | 0 | 1 | 0 | 1 | 0 | 0 | ... |
| $PS_1(t)$ | X | 0 | 1 | 1* | 0 | 1 | 0 | 0 | 0 | ... |
| $PS_2(t)$ | 0 | 0 | 1 | 1 | 0 | 1 | 1* | 0 | 0 | ... |
| $PS_3(t)$ | X | 0 | 0 | 0 | 1 | 1* | 1 | 0 | 0 | ... |

TABLE 4

| time point | 1 | 2 | 3 | 4 | 5 | 6 | 7 | 8 | 9 | ... |
|---|---|---|---|---|---|---|---|---|---|---|
| minimum state number | $S_2$ | $S_1$ | $S_2$ | $S_3$ | $S_3$ | $S_1$ | $S_0$ | $S_2$ | $S_3$ | ... |

In the above Table 3, the "0" of a path select signal is for left-selecting and the "1" of a path select signal is for right-selecting, among the two terms on the right side of equations (1-1) through (1-4). Also, asterisk (*) of a path select signal signifies that the unselected branch can also constitute a survive path. In this case, it is assumed that, for the consistency of ACS circuit 302, a "1" may be set as the default condition of path select signal.

Returning to FIG. 5, path memory apparatus 303 receives the path select signals and the minimum state number, and then saves the path transition history to produce a decoded information symbol every symbol period.

Figure 8:
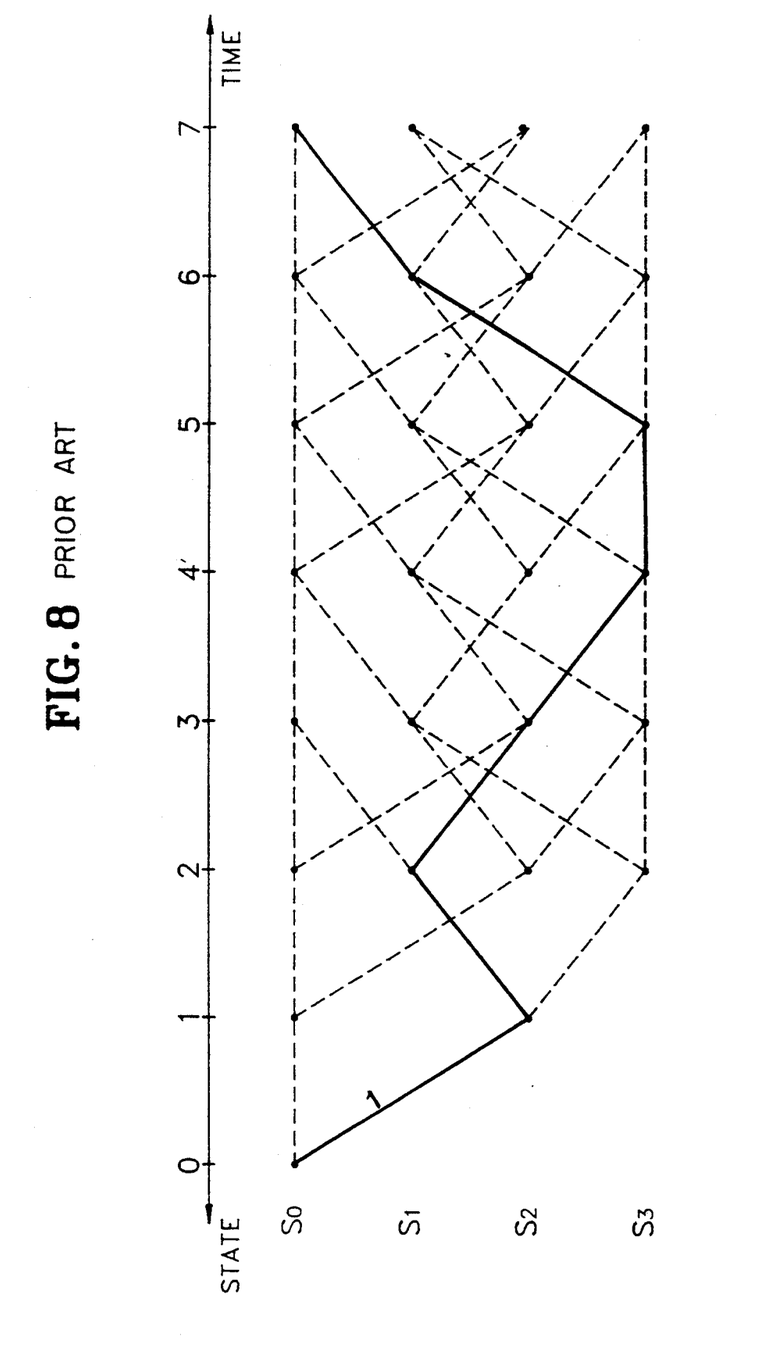
FIGS. 8, 9 and 10 are trellis diagrams for explaining the path trace-back algorithm.
Figure 9:
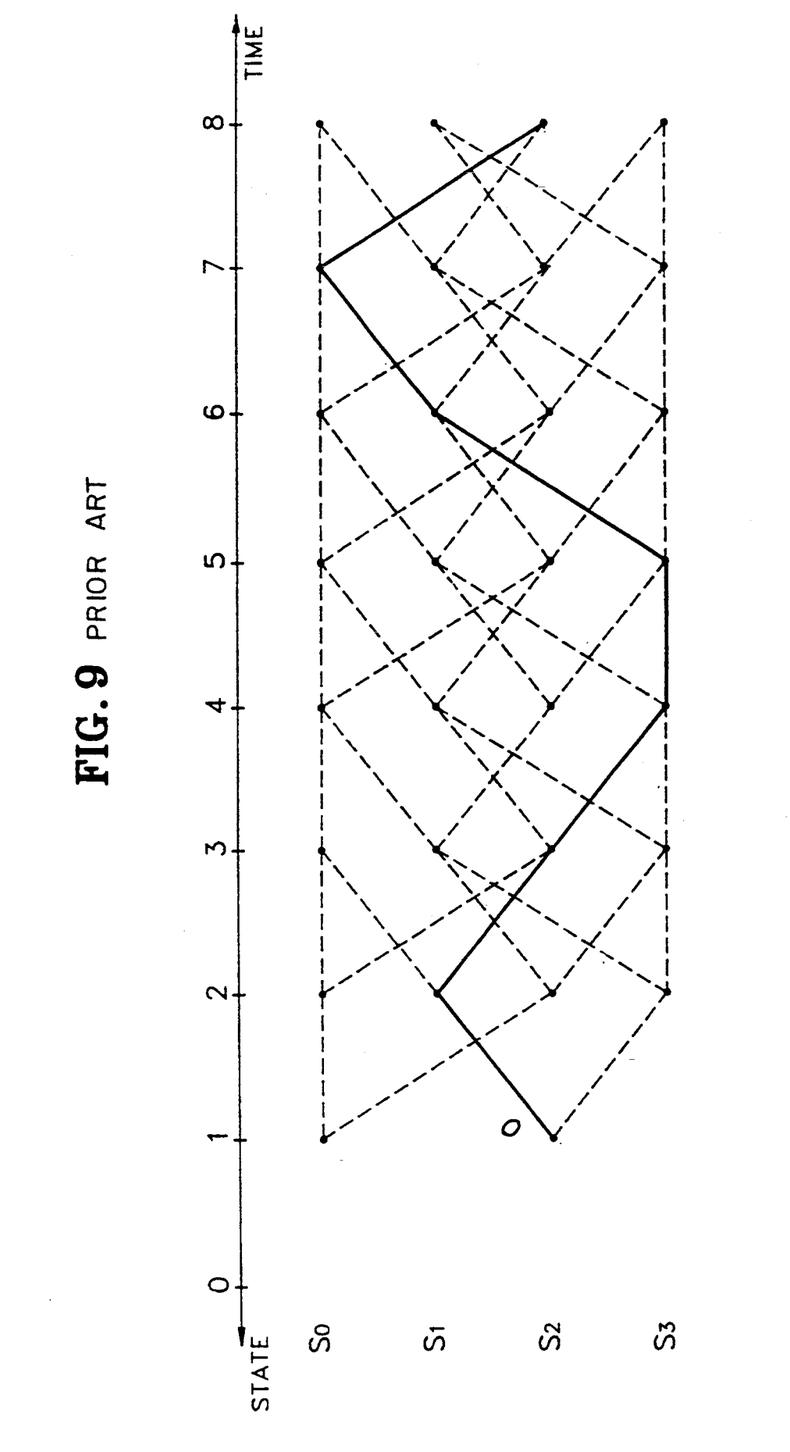
Figure 10:
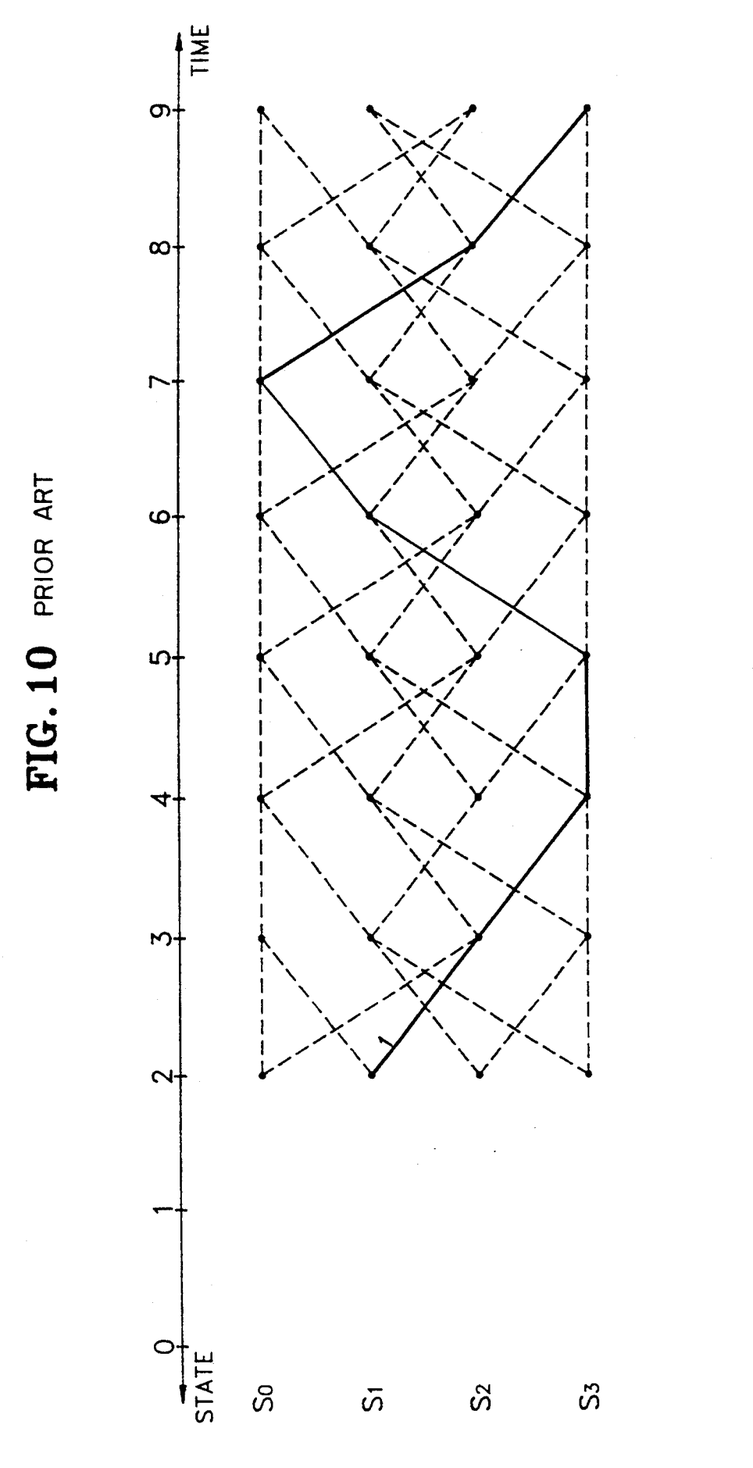

FIGS. 8, 9 and 10 show a trace-back algorithm when the depth of the trace is seven. A trace depth of seven results in a seven-symbol delay in the operation of the trace-back algorithm. At time point "7," the minimum state number is "$S_0$." The survive path which corresponds to the state $S_0$ at time point 7 is the maximum likelihood path and is followed by the trace-back algorithm. The information symbol which corresponds to the last branch of the maximum likelihood path is produced as a decoded information symbol. In FIG. 8, the decoded information symbol is "1." Referring to FIG. 9, time point 8 has a minimum state of $S_2$, which thus results in a decoded information symbol of "0." The decoded information symbol is "1" in FIG. 10.

Figure 11:
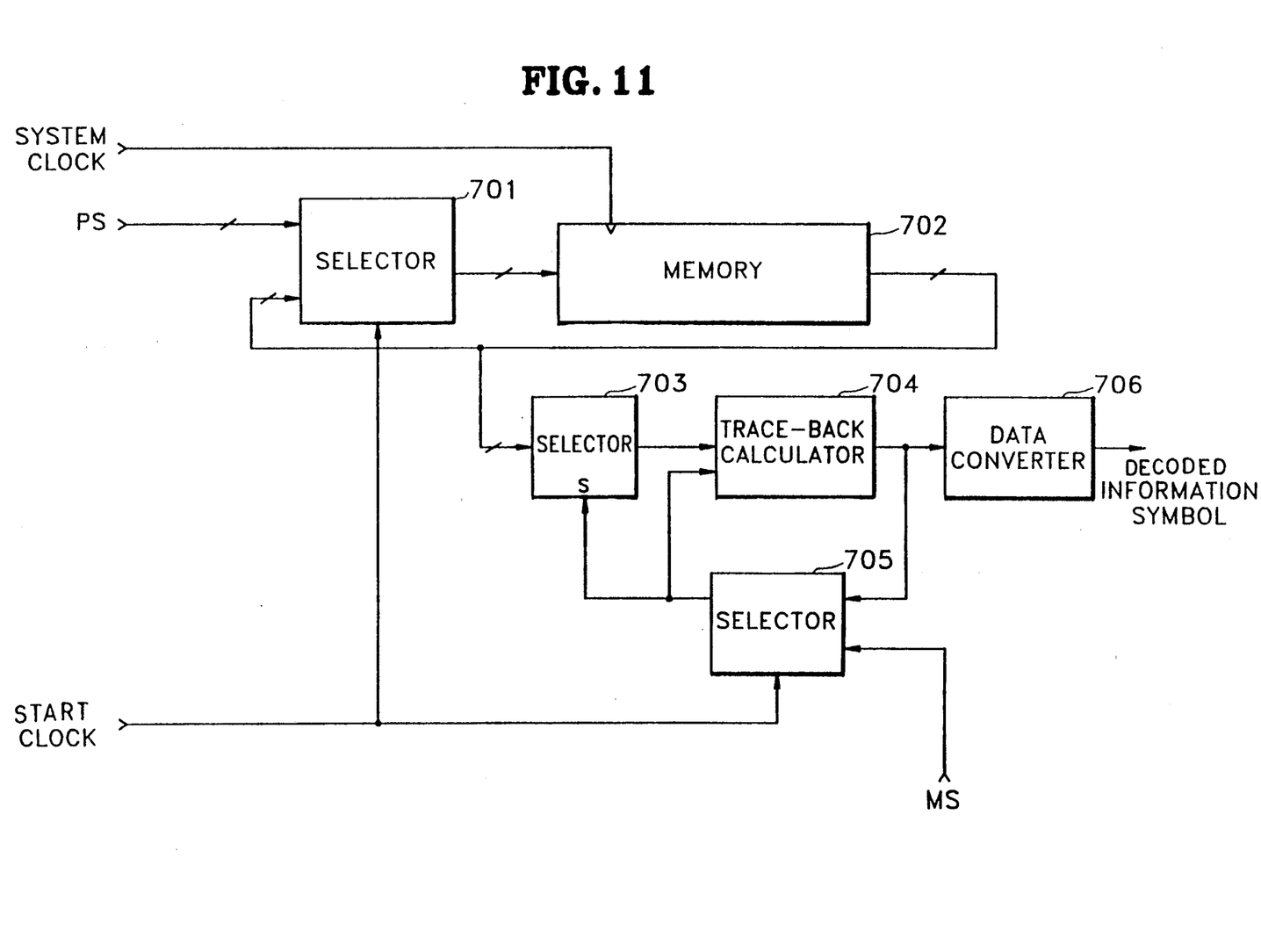
FIG. 11 is a block diagram of the path memory apparatus according to the present invention.

FIG. 11 is a block diagram of the path memory apparatus according to the present invention, which includes selectors 701, 703 and 705, a memory 702, a trace-back calculator 704 and a data converter 706.

Referring to FIG. 11, memory 702 may be in the form of shift registers each having tb+1 stages, provided that the depth of the trace-back is tb. Here, the stages of the shift registers are constructed in parallel. Memory 702 performs the shifting operation in accordance with the system clock. Here, memory 702 shifts in one direction, which results in reducing the structure of the path memory apparatus, whereas the memory of the conventional path memory apparatus, which uses RAM, necessitates a more complex structure.

Figure 12A:
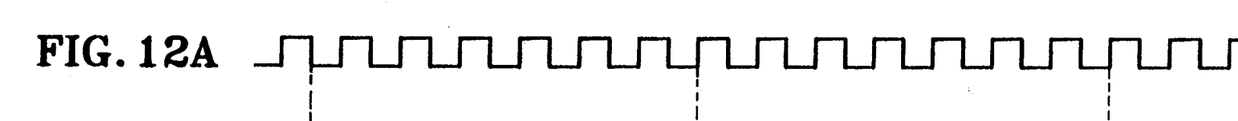
FIGS. 12A, 12B and 12C are waveform diagrams of the system clock, start clock and symbol clock, respectively.
Figure 12B:
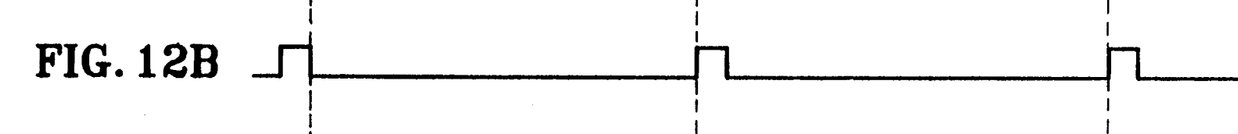
Figure 12C:
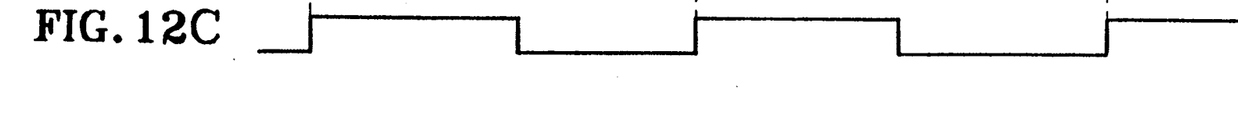

In accordance with the start clock, selector 701 selects between the outputs of memory 702 and the path select signals applied from ACS, and supplies the selected output to memory 702. In more detail, selector 701 selects the path select signals when the start clock is active, and selects the outputs of memory 702 when the start clock is not active. The start clock (FIG. 12B) is synchronously active every symbol clock pulse (FIG. 12C). The system clock ( FIG. 12A) is active tb times within one symbol duration.

The following Table 5 represents the operation of memory 702 in accordance with the system clock and the start clock. At this example, for the duration of the first 7 symbols, memory only saves the input signal, and then from the 8th symbol, the real trace back operation is performed. At the 8th symbol, the output of memory is PS(7) which corresponds to the path select signals of the 7th time point at the trellis diagram. These signal are transferred to selector 703 to produce the next trace back position as well as to feed back to memory input via selector 701.

TABLE 5

| symbol clock | system clock | memory contents | | | | | | |
|---|---|---|---|---|---|---|---|---|
| 1 | 1 | PS(1) | | | | | | |
|   | 2 |       | PS(1) | | | | | |
|   | 3 |       |       | PS(1) | | | | |
|   | ... | | | | | | | |
|   | 7 |       |       |       |       |       |       | PS(1) |
| 2 | 1 | PS(2) |       |       |       |       |       | PS(1) |
|   | 2 | PS(1) | PS(2) | | | | | |
|   | ... | | | | | | | |
|   | 7 |       |       |       |       |       | PS(1) | PS(2) |
| 3 | 1 | PS(3) |       |       |       |       | PS(1) | PS(2) |
|   | 2 | PS(2) | PS(3) |       |       |       |       | PS(1) |
| 4 | 1 | PS(4) |       |       |       | PS(1) | PS(2) | PS(3) |
| ... | ... | | | | | | | |
| 7 | 1 | PS(7) |       | PS(1) | PS(2) | PS(3) | PS(4) | PS(5) | PS(6) |
|   | ... | | | | | | | |
|   | 7 | PS(1) | PS(2) | PS(3) | PS(4) | PS(5) | PS(6) | PS(7) |
| 8 | 1 | PS(8) | PS(1) | PS(2) | PS(3) | PS(4) | PS(5) | PS(6) | PS(7) |
|   | 2 | PS(7) | PS(8) | PS(1) | PS(2) | PS(3) | PS(4) | PS(5) | PS(6) |
|   | 3 | PS(6) | PS(7) | PS(8) | PS(1) | PS(2) | PS(3) | PS(4) | PS(5) |
|   | ... | | | | | | | |
|   | 7 | PS(2) | PS(3) | PS(4) | PS(5) | PS(6) | PS(7) | PS(8) | PS(1) |

TABLE 5-continued

| symbol clock | system clock | memory contents | | | | | | | |
|---|---|---|---|---|---|---|---|---|---|
| 9 | 1 | PS(9) | PS(2) | PS(3) | PS(4) | PS(5) | PS(6) | PS(7) | PS(8) |
|   | 2 | PS(8) | PS(9) | PS(2) | PS(3) | PS(4) | PS(5) | PS(6) | PS(7) |
|   | 3 | PS(7) | PS(8) | PS(9) | PS(2) | PS(3) | PS(4) | PS(5) | PS(6) |
|   | ... |  |  |  |  |  |  |  |  |
|   | 7 | PS(3) | PS(4) | PS(5) | PS(6) | PS(7) | PS(8) | PS(9) | PS(2) |
| 10 | 1 | PS(10) | PS(3) | PS(4) | PS(5) | PS(6) | PS(7) | PS(8) | PS(9) |
|   | 2 | PS(9) | PS(10) | PS(3) | PS(4) | PS(5) | PS(6) | PS(7) | PS(8) |
|   | 3 | PS(8) | PS(9) | PS(10) | PS(3) | PS(4) | PS(5) | PS(6) | PS(7) |
| ... | ... |  |  |  |  |  |  |  |  |

In Table 5, PS(t) represents $PS_0(t)$-$PS_3(t)$ where t refers to the time point.

As shown in FIG. 11, the outputs of memory 702 are applied to selector 701 and selector 703. Selector 703 selects one of the outputs of memory 702 in accordance with the output of selector 705. Selector 705 selects one between the minimum state number MS and the output of trace-back calculator 704 in accordance with the start clock. In other words, selector 705 selects the minimum state number MS which is provided from ACS when the start clock is active, and selects the output of trace-back calculator 704 when the start clock is not active. Therefore, selector 705 produces the current state number to be traced, and selector 703 produces the path select signal which corresponds to the current state number to be traced. Trace-back calculator 704 receives the outputs of selectors 705 and 703 to produce the next state number to be traced back, as follows. Here, trace-back calculator 704 is implemented by a combinational logic circuit.

The following Table 6 is the truth table of trace-back calculator 704, which is for the convolutional coding scheme explained by FIGS. 2, 3 and 4.

TABLE 6

| selector 705 output | selector 703 output | trace-back |
|---|---|---|
| 00($S_0$) | 0 | 00 |
| 00($S_0$) | 1 | 01 |
| 01($S_1$) | 0 | 10 |
| 01($S_1$) | 1 | 11 |
| 10($S_2$) | 0 | 00 |
| 10($S_2$) | 1 | 01 |
| 11($S_3$) | 0 | 10 |
| 11($S_3$) | 1 | 11 |

Data converter 706 operates on the output of trace-back calculator 704 to produce a decoded information symbol every symbol period. In other words, data converter 706 receives the output of trace-back calculator 704 and then converts it to a decoded information symbol based on the convolutional coding scheme. For example, in the above convolutional coding scheme, the previous output to the last output of trace-back calculator 704 may be used to produce a decoded information symbol. That is, the previous output of $S_0$ or $S_1$ results in a decoded information symbol of "0," whereas the previous output of $S_2$ or $S_3$ produces a decoded information symbol of "1."

Figure 13:
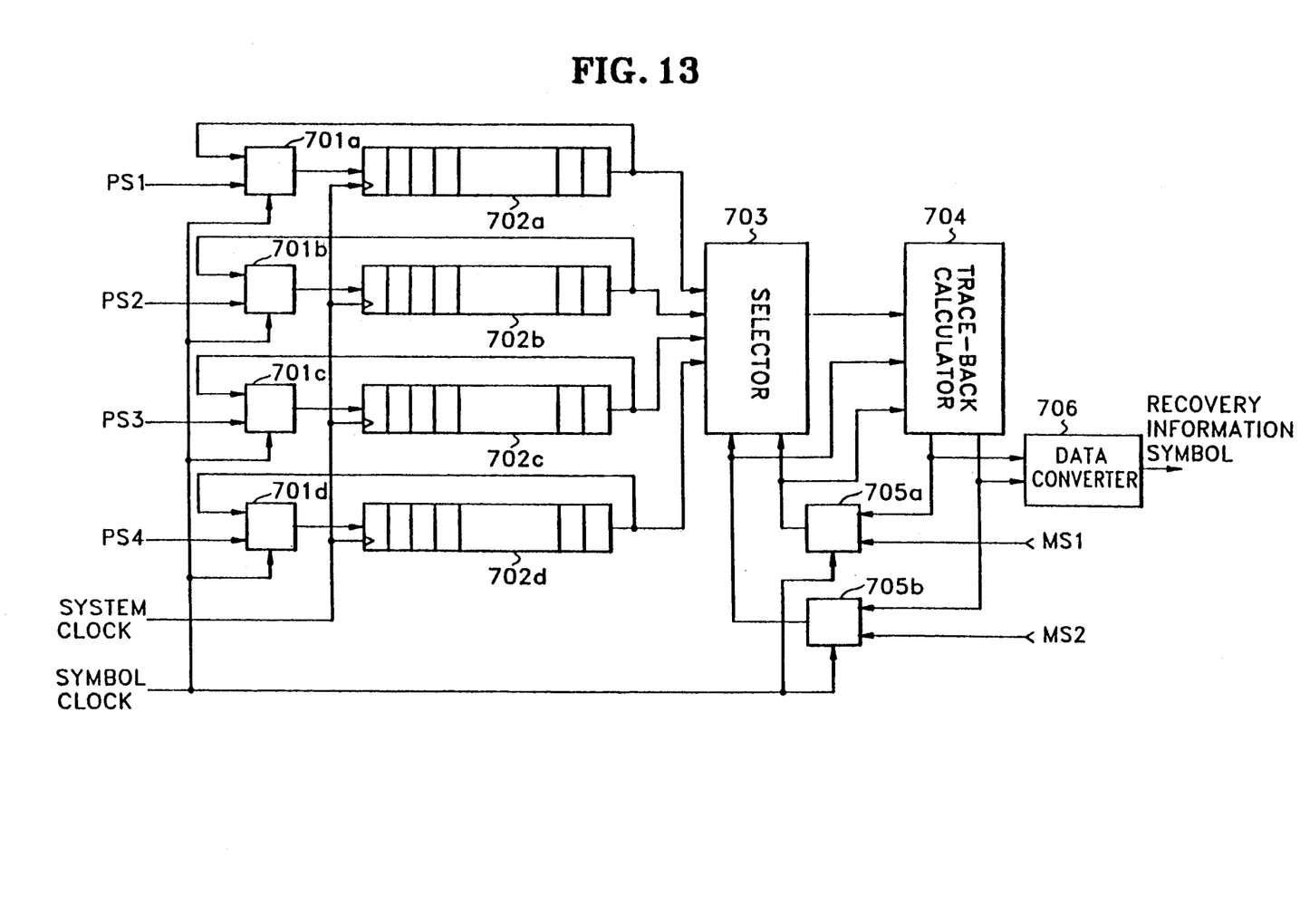
FIG. 13 is a detailed block diagram of the path memory apparatus according to the present invention.

FIG. 13 is a detailed block diagram of the path memory apparatus according to the present invention, wherein the number of states is four. In FIG. 13, selector 701 is made of four multiplexers 701a-701d which receive the path select signals PS1-PS4, respectively. Multiplexers 701a-701d also receive the outputs of the shift registers 702a-702d, respectively, and then select one of these in accordance with the start clock. Shift registers 702a-702d constitute the memory 702 of FIG. 11, which shift in only one direction in accordance with the system clock. Multiplexers 705a and 705b constitute selector 705.

As described above, the path memory apparatus has a memory for shifting in only one direction, which results in its structural simplification. In other words, a unidirectional-shift memory has a simpler structure than the bidirectional-shift memory, because the latter has a plurality of multiplexers for controlling the direction of shift. The path memory apparatus of the present invention can be implemented by an integrated circuit. Also, with the trace-back calculator and data converter implemented by logic circuits, the operation of the path memory apparatus is performed at high speed, which results in broader applications throughout the field of communication systems.

What is claimed is:

1. A path memory apparatus of a Viterbi decoder having an add-compare-select means for producing path select signals and a minimum state number every symbol period, the path memory apparatus comprising:
    first selecting means for selecting between the path select signals and feedback signals in accordance with a start clock;
    storing means for receiving the outputs of said first selecting means and shifting the received output in one direction in accordance with a system clock, and applying the outputs thereof to said first selecting means as the feedback signals;
    second selecting means for selecting one among the outputs of the memory means in accordance with a current state number;
    third selecting means for selecting between the minimum state number and a next state number in accordance with the start clock to produce the current state number;
    trace-back calculating means for receiving the current state number and the output of said second selecting means and then producing the next state number; and
    data converting means for operating on the next state numbers to produce a decoded information symbol per each symbol period.

2. A path memory apparatus claimed in claim 1, wherein said memory means comprises a plurality of shift registers each having tb+1 stages, tb being a value representing the trace-back depth.

3. A path memory apparatus claimed in claim 1, wherein said first selecting means comprises a plurality of multiplexers.

4. A path memory apparatus claimed in claim 1, wherein said third selecting means comprises a plurality of multiplexers.

5. A path memory apparatus claimed in claim 1, wherein said data converting means is implemented by a combinational logic circuit.

6. A path memory apparatus claimed in claim 1, wherein said start clock is synchronously active every symbol clock pulse.

7. A path memory apparatus claimed in claim 1, wherein said system clock is active tb times within one symbol duration, where tb is a value representing the trace-back depth.

* * * * *